United States Patent
Nakajima et al.

(10) Patent No.: US 7,298,629 B2
(45) Date of Patent: Nov. 20, 2007

(54) CIRCUIT BOARD FOR MOUNTING A SEMICONDUCTOR CIRCUIT WITH A SURFACE MOUNT PACKAGE

(75) Inventors: Yuji Nakajima, Tokyo (JP); Kana Onoko, Oita (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/341,675

(22) Filed: Jan. 30, 2006

(65) Prior Publication Data

US 2006/0172566 A1  Aug. 3, 2006

(30) Foreign Application Priority Data

Jan. 31, 2005  (JP)  ............... 2005-024450

(51) Int. Cl.
  *H05K 7/12*  (2006.01)
(52) U.S. Cl. .................... 361/808; 439/67; 174/262
(58) Field of Classification Search ........... 361/808; 439/67; 174/255, 262, 266
  See application file for complete search history.

(56) References Cited

U.S. PATENT DOCUMENTS

| 5,207,585 | A | * | 5/1993 | Byrnes et al. ........... 439/66 |
| 5,381,307 | A | * | 1/1995 | Hertz et al. ........... 361/767 |
| 5,764,485 | A | * | 6/1998 | Lebaschi ........... 361/774 |
| 5,896,037 | A | * | 4/1999 | Kudla et al. ........... 324/755 |
| 6,756,663 | B2 | * | 6/2004 | Shiraishi et al. ........... 257/686 |
| 7,005,586 | B1 | * | 2/2006 | Duley ........... 174/261 |
| 7,031,170 | B2 | * | 4/2006 | Daeche et al. ........... 361/813 |
| 2003/0043560 | A1 | * | 3/2003 | Clarkson et al. ........... 361/782 |

FOREIGN PATENT DOCUMENTS

| JP | 03285338 A | * 12/1991 |
| JP | 2003-078240 | 3/2003 |
| JP | 2005-309201 | * 11/2005 |

* cited by examiner

*Primary Examiner*—Michael C. Zarroli
(74) *Attorney, Agent, or Firm*—Pillsbury Winthrop Shaw Pittman LLP

(57) ABSTRACT

A circuit board has a plurality of pads arranged as a grid array in a quadrangle region. A surface mount type circuit component is connected to the circuit board through the pads. Each of pads arranged in the outermost side of the quadrangle region is formed in a substantially quadrangle shape in plan view.

3 Claims, 5 Drawing Sheets

CIRCUIT BOARD FOR MOUNTING A SEMICONDUCTOR CIRCUIT WITH A SURFACE MOUNT PACKAGE

CROSS-REFERENCE TO RELATED APPLICATIONS

This application is based upon and claims the benefit of priority from the prior Japanese Patent Application No. 2005-024450, filed on Jan. 31, 2005; the entire contents of which are incorporated herein by reference.

BACKGROUND

1. Field

The present invention relates to a circuit board for mounting a semiconductor circuit component having a surface mount type package. Particularly it relates to a circuit board for mounting a surface mount type circuit component which is formed so that electrodes formed in the bottom of a package are connected to pads of the board through metal bumps such as solder balls.

2. Description of the Related Art

As a wide variety of such packages serving as semiconductor circuit components to be mounted on circuit boards have advanced in recent years, surface mount type leadless packages which do not use any lead or pin for electric connection to the boards have been put into practical use broadly.

For example, a BGA (Ball Grid Array) package, an LGA (Land Grid Array) package, etc., are used as such surface mount type leadless packages. In the BGA package, connection terminals are formed in such a manner that solder balls are attached to electrodes (pads) which are formed, for example, as a grid array, on the bottom of the package so as to be connected to an external circuit. In the LGA package, pads (lands) formed as a grid array on the bottom of the package are used directly as connection terminals.

There is also known a CSP (Chip Size Package) having substantially the same size as that of a bare chip constituting a semiconductor. This CSP can be configured so that pads are provided on the bottom of the package so as to be connected to pads of a circuit board through solder balls or other metal bumps.

The BGA package is mounted on a circuit board by so-called reflow soldering which is performed in such a manner that soldering is performed by heating the solder balls while the solder balls are brought into contact with pads of the circuit board to be connected.

The LGA package is mounted on a circuit board through a socket provided with contactors being in contact with pads formed on the bottom of the package or the LGA package is mounted directly on a circuit board through solder balls attached to the pads.

The CSP can be also mounted on a circuit board substantially in the same manner as these circuit components.

When the circuit board mounted thus with the surface mount type semiconductor having no lead is attached to the inside of a housing of an electronic apparatus to use the circuit board, the circuit board is incorporated as one of constituent members of circuits in the electronic apparatus.

In a process of executing the circuit board incorporating operation, stress may be sometimes applied on the circuit board in a direction crossing a board surface or shock may be applied on the circuit board because of falling, etc. As a result, the circuit board may be warped or distorted. This may affect junction portions between the circuit component and the board, so that there is a possibility that the pads of the board will be peeled or soldered portions will be broken. There is a problem that the circuit board cannot fulfill its original function.

If the pads of the circuit board are peeled from the board body, the circuit board per se has to be exchanged for a new one. Accordingly, a considerably great deal of labor is required for assembling the electronic apparatus.

Particularly in recent years, there has been used the circuit board per se made of a thin material for reduction in size and thickness of the outer appearance of the electronic apparatus. In this case, the stiffness of the board is lowered so that the board is apt to be deformed by stress or shock applied externally. There is an increasing possibility that such an accident that peeling of the pads in the circuit board for mounting a surface mount type circuit component using no lead such as a BGA circuit component will occur.

For example, JP-A-2003-78240 has heretofore disclosed a proposal to prevent lowering of peel strength of the pads in such a manner that the pads of the circuit board mounted with a BGA circuit component or a CSP circuit component are formed so that pads in outermost circumferential corner portions become larger in diameter than pads in the other portions. In this proposal, the space of the circuit board cannot be used effectively because the pads are circular. Moreover, when external stress is applied, the external stress is concentrated at one point of an outer edge of each pad. There is therefore a problem that the pads are apt to be peeled.

DETAILED DESCRIPTION

Figure 9:
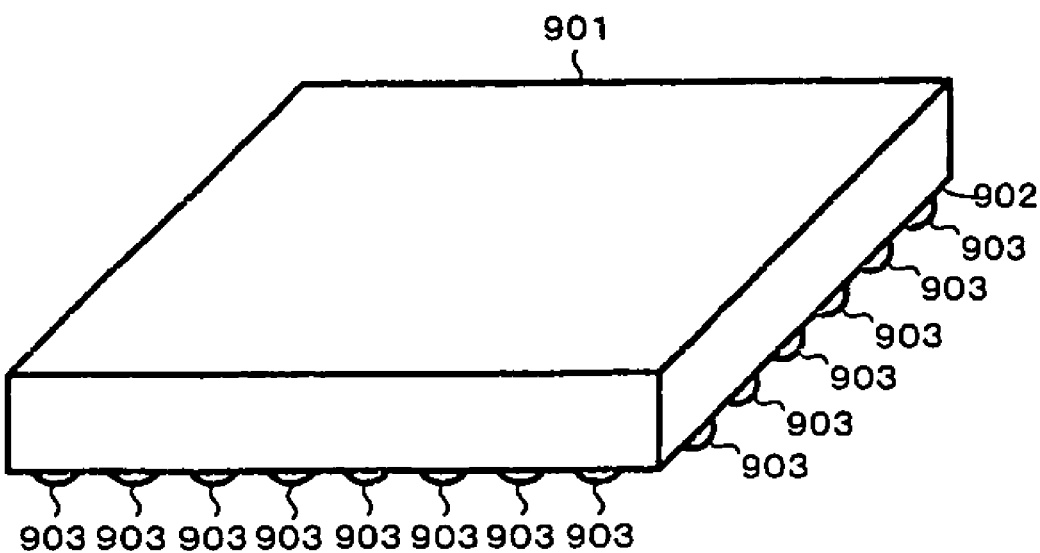
FIG. 9 is a perspective view for explaining a general BGA circuit component.
Figure 10:
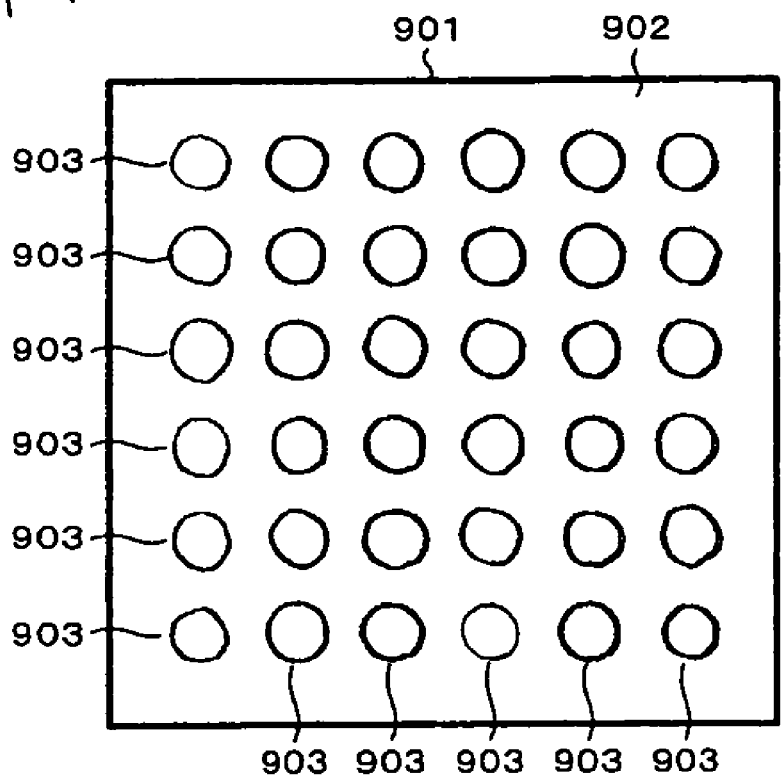
FIG. 10 is a view for explaining a state of arrangement of solder balls on the BGA circuit component depicted in FIG. 9.

Embodiments of the invention will be described below in detail with reference to the drawings. FIG. 9 is a perspective view for explaining a general BGA circuit component which is a surface mount type circuit component. FIG. 10 is a bottom view of the general BGA circuit component.

In FIG. 9, the BGA circuit component 901 has a semiconductor chip not shown but provided in its inside. The semiconductor chip is sealed with a synthetic resin package material shaped like a cube. Electrodes electrically connected to external connection electrodes of the semiconductor chip are arranged, for example, as a grid array, on the bottom 902 of the package. Solder balls 903 are further attached to the electrodes respectively.

FIG. 10 is a view of the BGA circuit component 901 depicted in FIG. 9, as seen from the bottom 902 side. The solder balls 903 are attached to the electrodes not shown but arranged as a grid array on the bottom 902.

Figure 1:
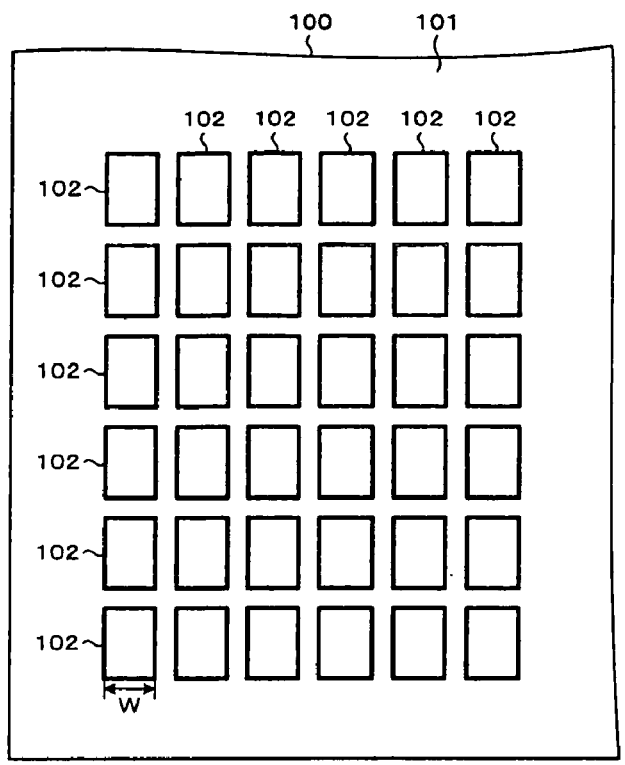
FIG. 1 is a plan view for explaining a circuit board according to an embodiment of the invention.

FIG. 1 is a view for explaining a circuit board according to an embodiment of the invention. The circuit board 100 has a circuit component mount surface 101, and pads 102 formed in correspondence to the arrangement of the solder balls of the BGA circuit component and provided for mounting the BGA circuit component.

Figure 2:
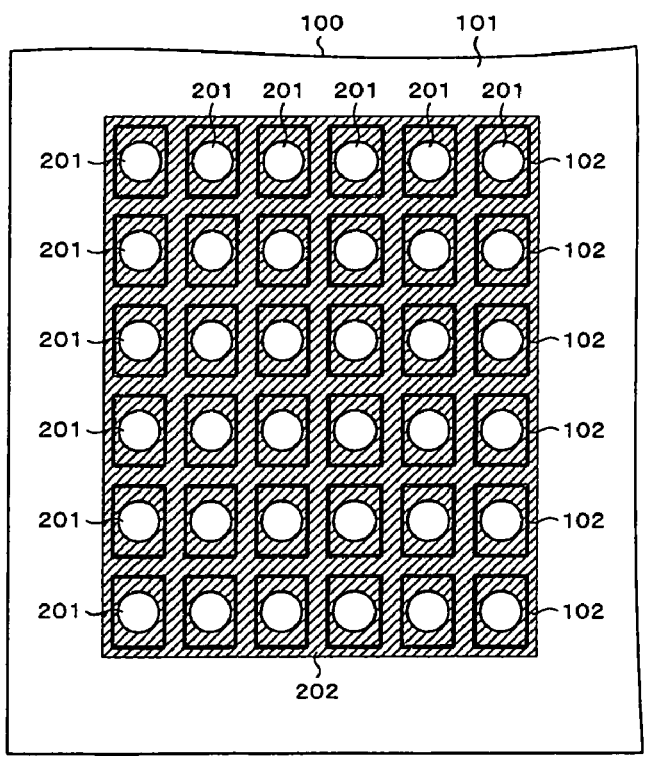
FIG. 2 is a plan view for explaining a state in which a solder resist is applied on the circuit board depicted in FIG. 1.

Each of the pads 102 is shaped like a rectangle. The width W of each pad 102 along a short side of the rectangle is set to be larger by a predetermined size than the diameter of each of the solder balls of the BGA circuit component. In practice, each pad 102 is covered with a solder resist in the condition that the circular shape with a diameter substantially equal to the diameter of each of the solder balls of the BGA circuit component is left. FIG. 2 shows an example of the pads. As shown in FIG. 2, the solder resist 202 represented by the hatched region is applied on a surface of each pad in the condition that the circular shape 201 with a diameter substantially equal to the diameter of each of the solder balls of the BGA circuit component is left.

Next, the effect of the pads each shaped like a rectangle will be examined. The peel strength of each pad is proportional to the area of the pad. That is, in this specification, the term "peel strength" means the degree of force by which the pad is actually peeled when force acts on the pad to peel the pad from the circuit board body. That is, the fact that peel strength is high means the fact that the pad is hardly peeled. It can be said that the peel strength of the pad increases as the area of the pad increases.

Figure 3:
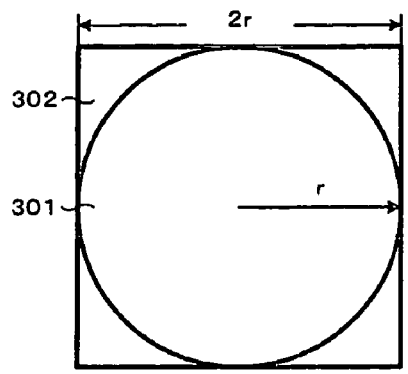
FIG. 3 is a view for explaining difference in junction area of a pad and a circuit board surface due to difference in shape of the pad.

When the case where the pad is shaped like a circle with a diameter of 2r as shown in FIG. 3 is compared with the case where the pad is shaped like a square 2r on a side, the area of the square is about 1.27 times as large as the area of the circle in accordance with $A2/A1=4r^2/\Pi r^2=4/\Pi$ in which $\Pi r^2$ is the area A1 of the circular pad 301, and $4r^2$ is the area A2 of the square pad 302.

When the pad is shaped like a rectangle, the peel strength of the pad can be made higher because the area of the rectangular pad is larger than the area of the square pad if the length of a short side of the rectangle is 2r.

When each pad is formed to have the minimum area required for connecting the pad to the solder ball of the BGA circuit component in this manner, the total area of the square pad becomes larger than that of the circular pad so that the peel strength can be made higher.

Next, difference in peel strength due to difference in shape will be described with reference to FIGS. 4A to 4C. When the area of a circular pad is equal to the area of a square pad, the peel strength of the square pad is higher than that of the circular pad.

Figure 4A:
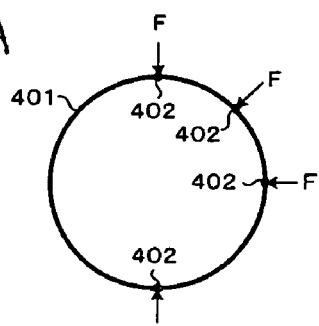
FIGS. 4A to 4C are views for explaining difference in peel strength due to difference in shape of the pad.

When the pad is circular, force F to peel the pad 401 is applied on approximately one point 402 in the outer edge of the pad 401 as shown in FIG. 4A. It is conceived that the pad 401 is apt to be peeled because the force F is applied concentratedly on such a narrow place.

Figure 4B:
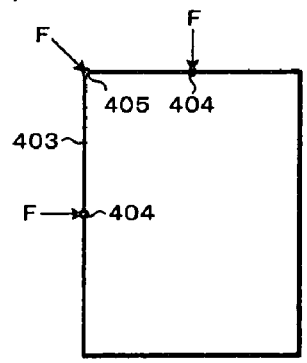
Figure 4C:
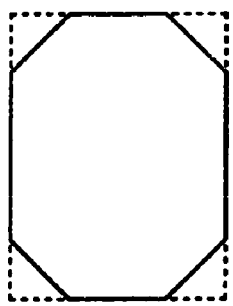

On the other hand, when the pad is rectangular, high peel strength is obtained with respect to force F applied on a point 404 in an intermediate region of each side of the pad 403 and in a direction orthogonal to the side, as shown in FIG. 4B.

Figure 5:
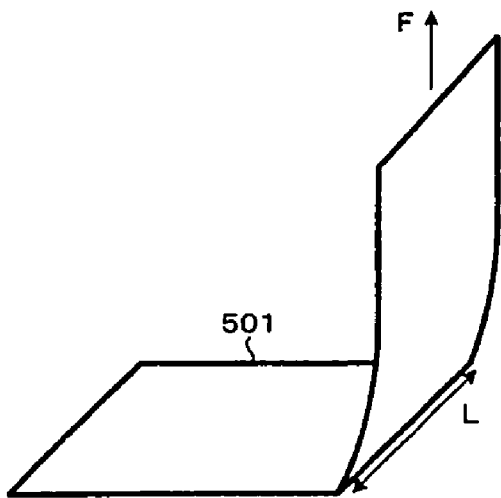
FIG. 5 is a view for explaining a state in which force to peel the pad is applied when the pad is rectangular.

It is supposed that this is because a phenomenon that the rectangular pad is hardly peeled unless larger force than the force required for peeling the circular pad is applied on the rectangular pad occurs as follows. According to simulation in the condition that a pressure sensitive adhesive tape 501 stuck on a certain surface is to be peeled as shown in FIG. 5, force F to peel the pressure sensitive adhesive tape 501 acts on the pressure sensitive adhesive tape 501 dispersively along the width L of the pressure sensitive adhesive tape 501.

As described above, in accordance with an embodiment of the invention, each pad is shaped like a square. Accordingly, a circuit board in which the peel strength of each pad is made high can be provided.

When the pad is square, high peel strength is obtained with respect to force applied on each side. When force F is applied on a corner portion 405 in FIG. 4B, it is however conceived that the pad is easily peeled like the circular pad because force is applied at one point. Therefore, when each corner portion of the square pad disposed in such an environment that force is applied on the corner portion 405 is cut linearly as shown in FIG. 4C, the total peel strength of the pad can be made higher.

When pads are formed on the circuit board body in correspondence with the positions of solder balls of the BGA circuit component, the pads are generally arranged as a grid array in a region, for example, formed of the edge shape of the bottom of the package of the BGA circuit component. In this case, the influence of force causing peeling on pads located in the outer side of the region is larger than the influence thereof on pads located in the inner side of the region, so that pads located in the outermost side are most intensively affected by the force. Moreover, when a region for provision of pads is square, pads located in corner portions of the region are more intensively affected by force causing peeling than pads located in the other portions. Accordingly, when each of pads in the outer side of the region for provision of pads is shaped like a rectangle while each of pads in corner portions is shaped like such a truncated rectangle that a rectangle is cut linearly at an angle on the corner portion side, peel strength can be made higher.

Figure 6:
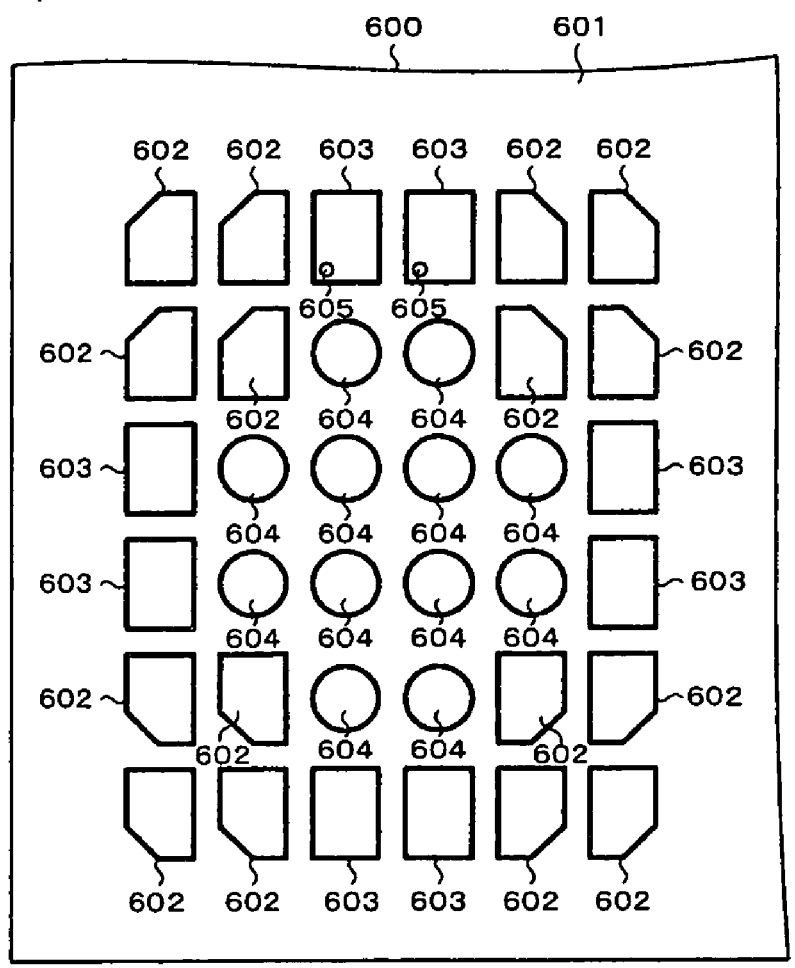
FIG. 6 is a plan view for explaining a circuit board according another embodiment of the invention.
Figure 7:
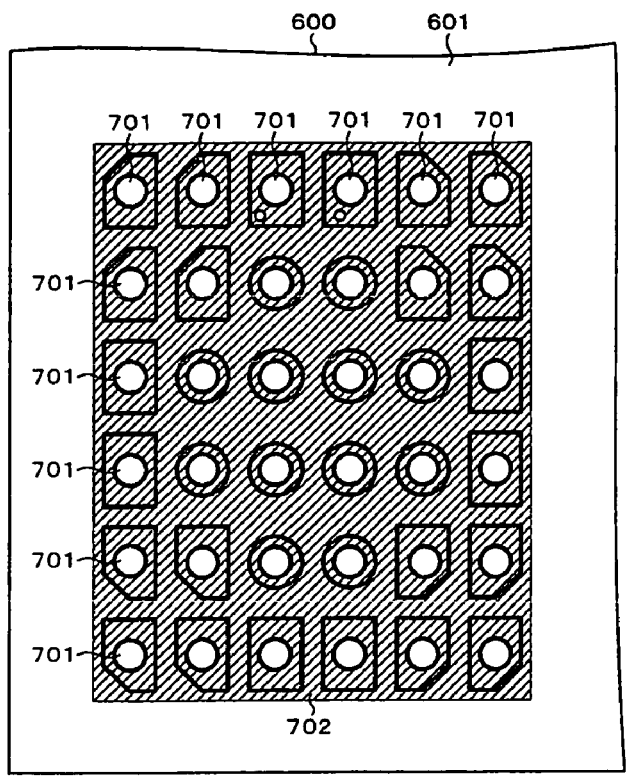
FIG. 7 is a plan view for explaining a state in which a solder resist is applied on the circuit board depicted in FIG. 6.

FIGS. 6 and 7 are views for explaining a circuit board according to another embodiment of the invention.

That is, as shown in FIG. 6, the circuit board 600 has pads arranged as a grid array in a rectangular frame. Among the pads, each of pads 603 located in the outermost circumferential portion of the frame is shaped like a rectangle while each of pads 602 located in corner portions (inclusive of one-inner portions on diagonal lines) of the frame is shaped like such a truncated rectangle that the rectangle is cut obliquely linearly at an angle on the corner side.

Although FIG. 6 shows the case where each of the other pads 604 located in the inner side of the frame is shaped like a circle, it is a matter of course that each of the pads 604 can be shaped like a rectangle.

FIG. 7 shows a state in which a solder resist 701 is applied on the respective pads 602, 603 and 604 except portions to which solder balls are connected.

Incidentally, small circles 605 added into two pads 603 in the central portion of the uppermost line in FIGS. 6 and 7 show through-holes.

In the embodiment shown in FIGS. 6 and 7, among the pads 602 to 604 arranged as a grid array in the rectangular frame, each of the pads 603 located in the outermost circumferential portion of the frame is shaped like a rectangle while each of four pads 602 located in each corner portion of the frame is shaped like such a truncated rectangular that the rectangle is cut obliquely linearly at an angle on the corner side.

As a result, the peel strength of the pads 603 located in the outermost circumferential portion and apt to be peeled can be made high. Moreover, because each of the four pads 602 located in each corner portion and apt to be peeled is shaped like such a truncated rectangle that the rectangle is cut linearly at an angle on the corner side, the phenomenon that force to peel the pad is applied concentratedly at one point on each corner of the pad can be avoided so that peel strength can be made higher.

Moreover, because the through-holes are provided, an excess of solder can be attached to the pads 603 provided with the through-holes so that peel strength of the pads can be made higher.

Figure 8:
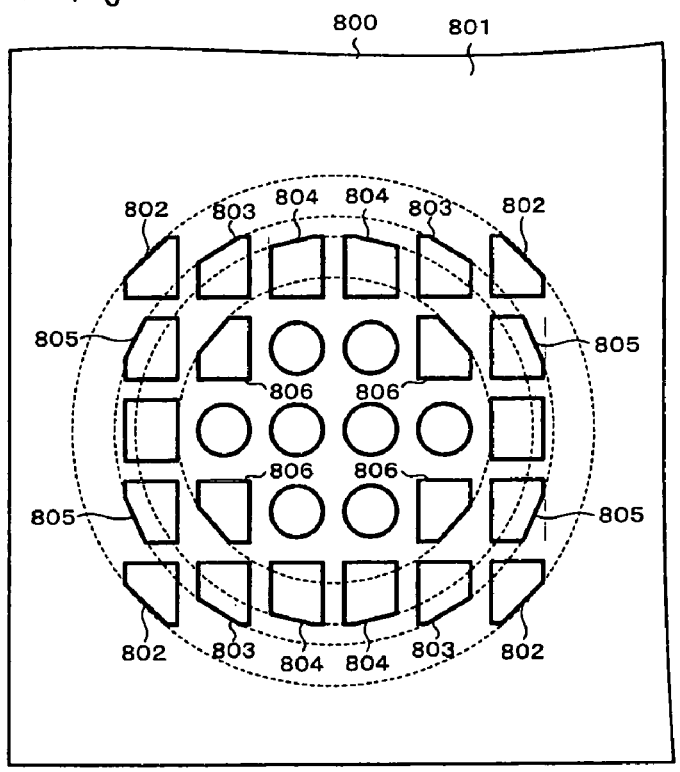
FIG. 8 is a plan view for explaining a circuit board according to still another embodiment of the invention.

FIG. 8 is a plan view for explaining a circuit board according to a further embodiment of the invention. In the embodiment shown in FIG. 8, the circuit board 800 has a circuit component mount surface 801, and pads arranged on a region of the circuit component mount surface 801. Among the pads, each of pads 802 to 806 arranged in corner portions of the region is cut linearly at an angle on the corner side so that the angle is set to be substantially equal to the angle of a line tangent to a concentric circle with the center of the region as its center. Incidentally, pads referred to by the same reference numeral are different in position of the cut corner portion but equal in angle.

According to this configuration, peel strength adequate and delicate in accordance with the position of provision of each pad can be given to the pad.

As described above, the circuit board according to the invention is configured so that square pads are arranged at least in portions where peeling is apt to occur. Accordingly, peel strength of the pads can be made high.

Among the pads arranged as a grid array in the rectangular frame, each of pads located in corner portions of the frame is cut obliquely linearly at a predetermined angle on the corner side. Accordingly, the phenomenon that each pad is peeled from the corner of the pad on the corner portion side can be retrained from occurring.

Moreover, when pads are provided with through-holes, the amount of deposited solder can increase so that peel strength can be made higher.

Incidentally, the circuit board according to the invention is not limited to the aforementioned embodiments and various modifications may be made without departing from the gist of the invention. For example, although the above description has shown the case where pads are connected to solder balls of a BGA circuit component, it is a matter of course that the invention can be also applied to the case where an LGA circuit component, not the BGA circuit component, is connected through metal bumps or the case where a CSP circuit component, not the BGA circuit component, is connected through metal bumps.

Although the above description has shown the case where pads are arranged in the whole of a rectangular frame, some BGA circuit component may be provided so that there is no electrode in the central portion of the bottom of the package but pads are arranged in several rows along the outer edge of the package. In this case, it is a matter of course that the circuit board according to the invention is formed to have pads in accordance with the arrangement of the electrodes.

What is claimed is:

1. A circuit board, comprising a plurality of pads arranged as a grid array in a quadrangle region;
   wherein a surface mount type circuit component is connected to the circuit board through the pads; and
   each of the pads located in a corner portion of the quadrangle region, is formed in a truncated rectangle shape in a plan view in such a form that a rectangle is cut linearly at an angle on a corner of the rectangle, wherein a position of the corner of the rectangle corresponds to a position of the corner portion of the quadrangled region with respect to the center of the quadrangle region.

2. The circuit board according to claim 1, wherein the rectangle is cut across by a straight line that is tangent to a concentric circle with an approximate center of the quadrangle region as its center.

3. The circuit board according to claim 1, wherein at least one pad of the plurality of pads has a soldering region, to which a solder ball is soldered, and a through-hole.

* * * * *